United States Patent [19]

Chen et al.

[11] Patent Number: 5,296,089
[45] Date of Patent: Mar. 22, 1994

[54] ENHANCED RADIATIVE ZONE-MELTING RECRYSTALLIZATION METHOD AND APPARATUS

[75] Inventors: Chenson K. Chen, Weston; James Im, Cambridge, both of Mass.

[73] Assignee: Massachusetts Institute of Technology, Cambridge, Mass.

[21] Appl. No.: 981,189

[22] Filed: Nov. 24, 1992

Related U.S. Application Data

[60] Division of Ser. No. 251,558, Sep. 30, 1988, Pat. No. 5,173,271, which is a continuation-in-part of Ser. No. 238,311, Aug. 30, 1988, Pat. No. 5,160,575, which is a continuation-in-part of Ser. No. 124,346, Nov. 20, 1987, Pat. No. 4,889,583, which is a continuation of Ser. No. 805,117, Dec. 4, 1985, abandoned.

[51] Int. Cl.$^5$ ............................................. C30B 13/16
[52] U.S. Cl. .................. 156/620.7; 156/603; 156/616.1; 156/620.71; 156/620.73; 156/620.75; 156/DIG. 64
[58] Field of Search .................. 156/603, 616.1, 616.2, 156/616.4, 620.7, 620.71, 620.73, 620.75; 164/122.2; 148/DIG. 60; 428/195; 422/245

[56] References Cited

U.S. PATENT DOCUMENTS

| | | | |
|---|---|---|---|
| 3,158,505 | 11/1964 | Sandor | 437/238 |
| 3,539,759 | 11/1970 | Spiro et al. | 156/613 |
| 3,627,590 | 12/1971 | Mammel | 437/94 |
| 4,113,547 | 9/1978 | Emanuel et al. | 156/612 |
| 4,135,027 | 1/1979 | Anthony et al. | 156/620.71 |
| 4,277,320 | 7/1981 | Beguwala et al. | 437/242 |
| 4,280,989 | 7/1981 | Seimiya et al. | 423/344 |
| 4,371,421 | 2/1983 | Fan et al. | 156/620.71 |
| 4,435,447 | 3/1984 | Ito et al. | 437/241 |
| 4,448,632 | 5/1984 | Akasaka | 156/603 |
| 4,479,846 | 10/1984 | Smith et al. | 156/603 |
| 4,493,977 | 1/1985 | Arai et al. | 118/725 |
| 4,503,807 | 3/1985 | Nakayama et al. | 118/719 |
| 4,504,730 | 3/1985 | Shimizu | 118/725 |
| 4,535,227 | 8/1985 | Shimizu | 118/725 |
| 4,535,228 | 8/1985 | Mimura et al. | 118/725 |
| 4,562,106 | 12/1985 | Geis et al. | 428/195 |
| 4,659,422 | 4/1987 | Sakurai | 156/620.71 |
| 4,694,143 | 9/1987 | Nishimura et al. | 118/725 |
| 4,888,302 | 12/1989 | Ramesh | 156/603 |
| 4,889,583 | 12/1989 | Chen et al. | 156/604 |
| 4,990,374 | 2/1991 | Keeley et al. | 118/725 |
| 5,033,407 | 7/1991 | Mizuno et al. | 118/725 |
| 5,034,199 | 7/1991 | Zavracky et al. | 422/245 |
| 5,074,952 | 12/1991 | Zavracky et al. | 156/620.7 |
| 5,120,509 | 6/1992 | Zavracky et al. | 156/603 |
| 5,160,575 | 11/1992 | Chen | 156/620.7 |
| 5,173,271 | 12/1992 | Chen et al. | 422/245 |

FOREIGN PATENT DOCUMENTS

| | | |
|---|---|---|
| 0071731 | 2/1983 | European Pat. Off. |
| 61-219130 | 9/1986 | Japan |
| 62-4314 | 1/1987 | Japan |
| 62-4315 | 1/1987 | Japan |
| 62-282431 | 8/1987 | Japan |
| WO89/04386 | 5/1989 | PCT Int'l Appl. |

OTHER PUBLICATIONS

Fan et al., "Graphite-Strip-Heater Zone-Melting Recrystallization of Si Films" *Jrnl. Crys. Growth*, vol. 63 (1983) pp. 453–483.

Robinson et al., "Large Area Recrystallization of Polysilicon with Tungsten-Halogen Lamps", *Jrnl. Crystal Growth*, vol. 63 (1983) pp. 484–492.

Geis et al., "Zone-Melting Recrystallization of Si Films with a Moveable-Strip Heater Oven", *Jrnl. Electro. Chem. Tech.*, Dec. 1982.

Pinizzotto R. F., "Microstructural Defects in Lazer Recrystallized Graphite Strip Heater . . . Systems: A Status Report", *Jrnl Crys. Growth*, vol. 63 (1983) pp. 559–582.

*Primary Examiner*—Asok Pal
*Attorney, Agent, or Firm*—Hamilton, Brook, Smith & Reynolds

[57] ABSTRACT

A method is provided for zone-melting-recrystallization (ZMR) to produce high quality substantially subboundary-free silicon-on-insulator (SOI) thin films by controlled radiant heating of the silicon film. Using this technique, a much wider experimental parameter range which improves the uniformity of the crystalline quality over the entire SOI film is possible.

10 Claims, 3 Drawing Sheets

ENHANCED RADIATIVE ZONE-MELTING RECRYSTALLIZATION METHOD AND APPARATUS

The Government has rights in this invention pursuant to Grant Number F19628-85-C-0002 awarded by the Department of the Air Force.

CROSS-REFERENCE TO RELATED APPLICATIONS

This application is a divisional application of U.S. Ser. No. 07/251,558 filed Sep. 30, 1988, now U.S. Pat. No. 5,173,271, which is a continuation-in-part of U.S. Ser. No. 07/238,311 filed Aug. 30, 1988, now U.S. Pat. No. 5,160,575, which is a continuation-in-part of U.S. Ser. No. 124,346 filed on Nov. 20, 1987, now U.S. Pat. No. 4,889,583 which is a continuation of U.S. Ser. No. 805,117 filed on Dec. 4, 1985, now abandoned, all of said applications being incorporated herein by reference.

BACKGROUND OF THE INVENTION

This invention relates generally to the conversion of amorphous or polycrystalline semiconductor materials to substantially single crystal semiconductor material by a process known as zone-melting recrystallization.

From transistors to very large scale integration of complex circuitry on a single chip, the field of solid state electronics has been built largely upon the abundant non-metallic element silicon. Large diameter single crystal boules of silicon are sliced into wafers on which dopants, insulators and conductors are applied using a variety of processes. Over the past few years, a major effort has been devoted to developing a new silicon-based technology involvinq the preparation of very thin films of pure single crystal silicon on the the order of one-half micron thick, compared to the one-half millimeter thickness of typical silicon wafers. This emerging technology is called silicon-on-insulator (SOI) technology because the thin silicon (sic) film is supported by an insulating substrate. An efficient, reliable and economical process for producing thin film single crystal silicon has eluded researchers until now.

In comparison to device performance in bulk silicon, SOI promises significant advantages:

(1) improved speed performance in discrete devices and circuits resulting from reduced parasitic capacitance;

(2) simplified device isolation and design layout, yielding potentially higher packing densities; and (3) radiation hard circuits for space and nuclear application.

In addition, new SOI technologies may also be utilized for three-dimensional integration of circuits.

At present, there is one relatively mature SOI technology, silicon-on sapphire (SOS). However, the commercial utilization of SOS has been severely limited by its high cost, relatively poor crystalline quality, and difficulty in handling and processing in comparison to bulk Si.

Recently, a new SOI technology called zone-melting recrystallization (ZMR) based on standard silicon wafers rather than sapphire crystals has exhibited the potential for displacing SOS and for utilization on a much larger scale by the semiconductor industry.

In known ZMR techniques, SOI is produced by recrystallizing a fine-grained Si film on an insulating substrate. A typical sample structure consists of a silicon wafer coated with a 1-micron, thermally grown $SiO_2$ insulating layer, a half micron polycrystalline silicon (poly-Si) layer formed by low pressure chemical vapor deposition (LPVCD), capped by a 2-micron layer of CVD $SiO_2$. The last layer forms a cover to encapsulate the polysilicon film constraining it while the film is being recrystallized.

The ZMR technique for SOI is described in a paper entitled "Zone Melting Recrystallization of Silicon Film With a Movable Strip Heater Oven" by Geis et al., *J. Electrochem. Soc. Solid State Science and Technology*, Vol., 129, p. 2812 (1982).

The sample is placed on a lower graphite strip and heated to a base temperature of 1100–1300° in an argon gas ambient. Silicon has a melting point of about 1410° C.; $SiO_2$ has a higher melting point, about 1710° C. Additional heat in the form of radiant energy is typically provided by a movable upper graphite strip heater which produces localized heating of the sample along a strip to a temperature between the two melting points. The upper heater scans the molten silicon zone across the sample leaving behind a recrystallized monocrystalline SOI film beneath the $SiO_2$ cap.

The development of ZMR, however, has been frustrated by processing problems. The interface between the molten silicon and adjacent silicon dioxide layers gives rise to the so-called silicon beading phenomenon during ZMR which can fracture the $SiO_2$ cap and lead to defects in the crystalline structure of the silicon. A solution to this problem is the subject of the above-referenced U.S. application Ser. No. 805,117.

A second obstacle to the commercial utilization of ZMR has been the presence of excessive edge defects and warping which result from heat buildup about the periphery of the wafer during processing. These defects require post-ZMR processing to both improve the cosmetic appearance and prepare the crystal for automated semiconductor processing. These problems are addressed by the patent application U.S. Ser. No. 238,311.

Yet another problem encountered in the ZMR method involves the presence of low angle grain boundaries or subboundaries in processed wafers which interrupt the crystalline structure in the silicon film and thereby reduce utility of the film in electronic applications.

Major ZMR research in past few years has been focused on eliminating these subboundaries. Recently, elimination of such defects was realized in one micron (1 um) Si SOI materials using low moveable strip heater power and velocity conditions. The precision and accuracy of the various experimental parameters required to produce this subboundary-free material was so high, however, that it was very difficult to practice. Furthermore, the range of acceptable parameters becomes even more restrictive in the manufacture of technologically and commercially more important half micron (0.5 um) SOI wafers.

SUMMARY OF THE INVENTION

It is therefore the object of the present invention to provide an improved method for producing subboundary-free SOI wafers over a wider range of experimental parameters The present invention provides a ZMR process employing radiative heat sources to obtain subboundary-free materials even in 0.5 micron SOI wafers by enhancing the radiative effect and increasing the ability to control the radiation intensity profile. In this new technique, the SOI wafer is first heated to a base temperature below the melting point of silicon by radiative heating using a radiative source directly facing the SOI wafer film structure. The moveable strip heater then scans across the wafer in the space between the wafer and radiative source, thereby radiatively heating the silicon film, creating a molten zone and leaving behind a recrystallized single crystal layer of silicon.

In a first aspect of the present invention a method is provided for preparing a SOI wafer having an amorphous semiconductor material film on a substrate comprising supporting the wafer, radiatively heating the film to a base temperature below the melting point of the film, heating regions of the film with radiant energy to melt the film, and solidifying the film to produce substantially monocrystalline semiconductor material.

In other aspects, the heating to melt the film and the solidifying includes successively heating to melt and solidifying contiguous regions of the film.

In yet other aspects, the radiation intensity profile is controlled at the film surface.

In other aspects, the radiatively heating to the base temperature includes uniformly illuminating the film over the wafer area. Preferably, a first radiative source is provided for heating to the base temperature and a second source is provided for heating to melt the film and the radiant heat input is controlled by adjusting the relative radiation contribution of the first and second sources.

In other aspects of the invention, the heating to the base temperature is done by a combination of radiative and conductive heating. Preferably, a first source is provided for radiatively heating to the base temperature, a second stationary source is provided for conductively heating to the base temperature and a third source is provided for radiatively heating to melt the film and the radiant heat input is controlled by controlling the relative heat contribution of the first, second and third sources.

In another aspect of the invention, supporting the wafer includes supporting the wafer about the periphery of the wafer with an annular support member, preferably, the supporting member being a heat sink or an insulating member for reducing edge defects.

BRIEF DESCRIPTION OF THE DRAWINGS

The drawings are briefly described as follows.

DESCRIPTION OF THE PREFERRED EMBODIMENTS

The following description generally relates to silicon semiconductors While silicon is by far the most important semiconductor material in use today, the invention is applicable by analogy to other semiconductor materials such as gallium arsenide and germanium.

Figure 1:
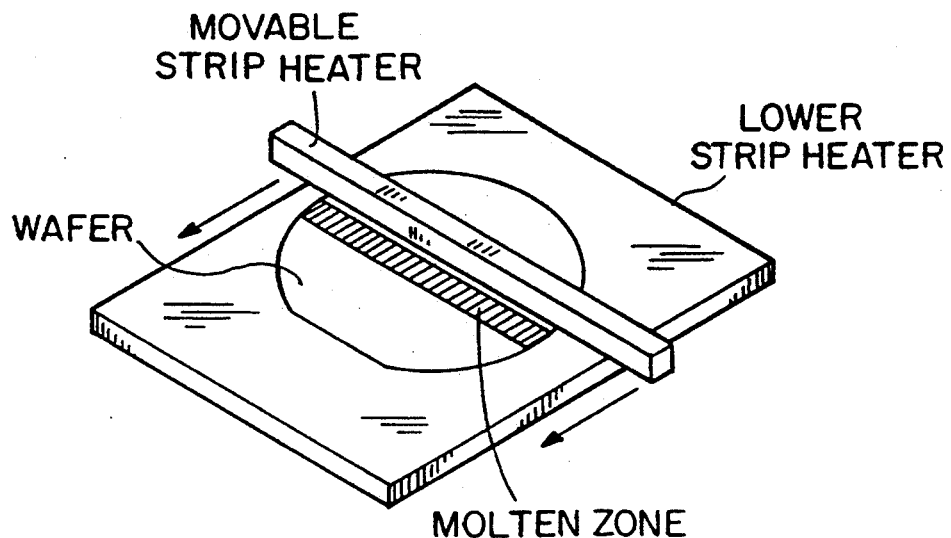
FIG. 1 is a schematic isometric view of an encapsulated SOI undergoing conventional ZMR.

FIG. 1 illustrates the thermal components of a typical conventional ZMR apparatus, namely, the stationary lower heater and the movable upper strip heater. The lower heater or susceptor is formed by a thin rectangular sheet of graphite. Opposite ends of the lower strip heater are connected in circuit to a source of electrical current in order to achieve controlled heating of a single wafer with formed SOI structure. The movable upper heater typically comprises an elongated graphite strip with a square cross-section of about 1 sq mm in area. The length of the upper heater more than spans the wafer and is spaced about 1 mm above the wafer surface. The ends of the upper heater are connected in an electrical circuit for resistive heating.

Figure 2:
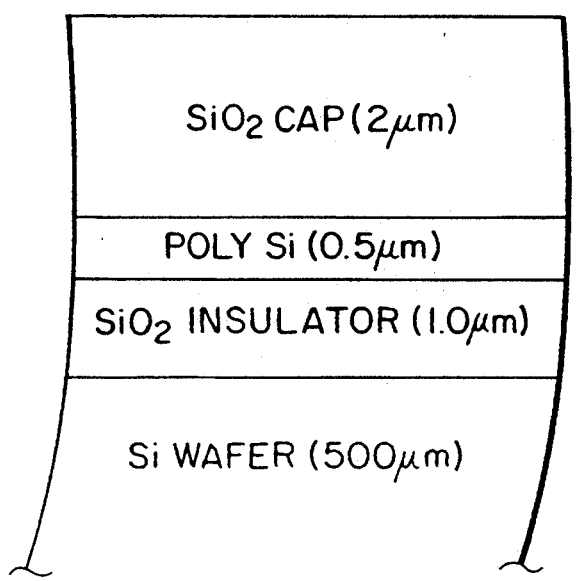
FIG. 2 is a schematic diagram of the cross-section of a typical SOI structure.

The layers of an encapsulated SOI wafer are diagramed in cross section in FIG. 2. A typical sample consists of a silicon wafer coated with a 1-micron thermally-grown $SiO_2$ layer, a 0.5-micron poly-Si film formed by LPCVD, capped by a 2-micron layer of CVD $SiO_2$. Prior to the process disclosed in the parent application, an additional 30 nm cladding layer Si-rich $Si_3N_4$ was deposited by RF sputtering or CVD on top of the $SiO_2$ cap to promote wetting of the molten Si film on $SiO_2$ during ZMR. The otherwise useless nitride layer is obviated by the parent invention.

In the conventional ZMR procedure the wafer of FIG. 2 is placed cap-side up (cap facing the movable heater) on the lower strip heater (FIG. 1). The silicon film is conductively heated to a base temperature of 1100-1300° C., typically in an argon gas ambient. That is, heat from the lower heater is conducted through the wafer and insulator to the film itself. The upper strip heater is heated to about 2200° C. and radiates energy onto the $SiO_2$ cap of the wafer below. With the $SiO_2$ cap being substantially transparent to the radiation, the polymorphous silicon film is in radiative contact with the movable strip-heater source and is heated radiantly rather than via thermal conduction. The strip-like zone beneath the movable strip heater is thus radiatively heated to a temperature just above the poly-Si melting point, e.g., 1410° C., well below the melting point of $SiO_2$, thus melting the polysilicon in a band beneath the solid $SiO_2$ cap. As the upper heater moves across the face of the wafer, the molten zone is scanned across the sample leaving behind a recrystallized SOI film. In this manner, the polycrystalline silicon layer is converted to a single crystal layer suitable for semiconductor devices.

Figure 3:
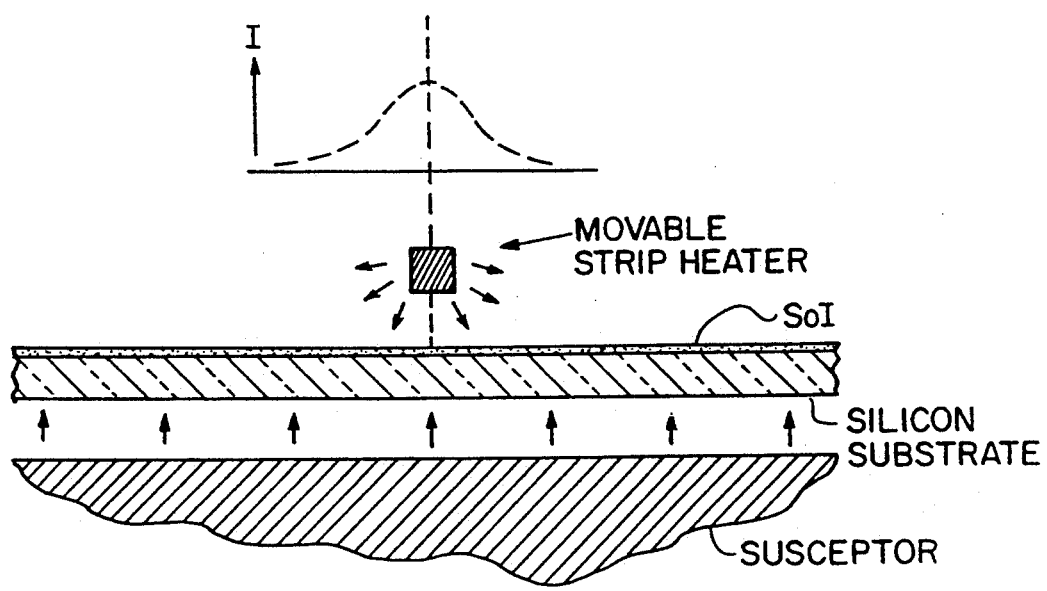
FIG. 3 is a side view showing heat flow of an SOI wafer undergoing conventional ZMR, the insulator, film and cap being represented as a single layer, with a superimposed graph of the radiative intensity versus displacement.

The heat flow from the heaters to the wafer in the conventional ZMR technique is shown in FIG. 3. The wafer is heated to the base temperature through heat produced at the lower susceptor and conducted through the supporting silicon substrate. The upper strip heater then radiatively heats the polymorphous silicon film, from a position just above the wafer (placed with the cap facing the movable heater) as it scans to melt the polysilicon band and leave behind substantially monocrystalline silicon. At the crystallizing interface between molten and recrystallized silicon, the film is heated by the lower heater via thermal conduction through the silicon substrate and by the upper heater both directly by radiation and via lateral conduction through the radiatively heated molten silicon zone. Beneath the strip heater a radiative intensity profile exists as illustrated by the dashed line of the graph in FIG. 3 in which intensity increases in the direction of the arrow I. The highest radiation intensity impinges on that portion of the wafer directly beneath the strip heater and those portions adjacent to the strip heater receive relatively less radiation.

Unfortunately, however, wafers produced by this technique exhibit crystalline defects in the silicon film known as low angle grain boundaries or subboundaries which interrupt the silicon lattice structure and reduce the silicon film quality. As discussed by Im, Chen et al. in "Liquid-solid Interface Morphologies and Defect Structures in Zone-Melting Recrystallized Silicon-On-Insulator Films", *Materials Research Society Symposium Proceedings*, Vol 107, P. 169, 1988, for subboundary free films, the interface must be stable with respect to its progress across the wafer and exhibit a preferred cellular morphology.

We have discovered that a controlled amount of radiative heating is needed to produce a stable cellular solidification interface. Conventional ZMR in practice, provides a limited flexibility to control radiative effects at the solidification interface. This disadvantage arises partially due to the radiative heat input representing only a small fraction of total heat input. The conductive heat input from both the susceptor and the lateral conduction of heat after absorption of radiant energy contribute most of the total. Conductive heating predominates. In regions not directly beneath the upper strip heater, in the outer wings of the radiation-intensity profile, the relative amount of direct radiative heating is even further reduced. Thus, subboundary-free and low defect density material may be achieved only for a relatively narrow molten zone width interval under the heater. Once the molten zone becomes larger or smaller than critical sizes, thereby effecting the relative amount of radiative heating, the condition for producing low defect density wafers, namely, a stable, cellular solidification interface is quickly lost. Furthermore, the range of experimental parameters corresponding to such an interval imposes almost impossible precision and accuracy requirements for the operation of conventional ZMR apparatus, especially when forming SOI films less than or approximately equal to 0.5 micron thickness.

The present invention provides a ZMR process employing radiative heat sources to obtain subboundary-free materials even in 0.5 micron SOI wafers by enhancing the radiative effect and increasing the ability to control the radiation intensity profile. In this new technique, the SOI wafer is first heated to a base temperature below the melting point of silicon by radiative heating using a radiative source directly facing the SOI wafer film structure. The moveable strip heater then scans across the wafer in the space between the wafer and radiative source, thereby radiatively heating the silicon film, creating a molten zone and leaving behind a recrystallized single crystal layer of silicon. Although this concept can be carried out in various radiant heat source arrangements, the simplest set up can also be readily adopted by the conventional ZMR chambers as will now be described.

Figure 4:
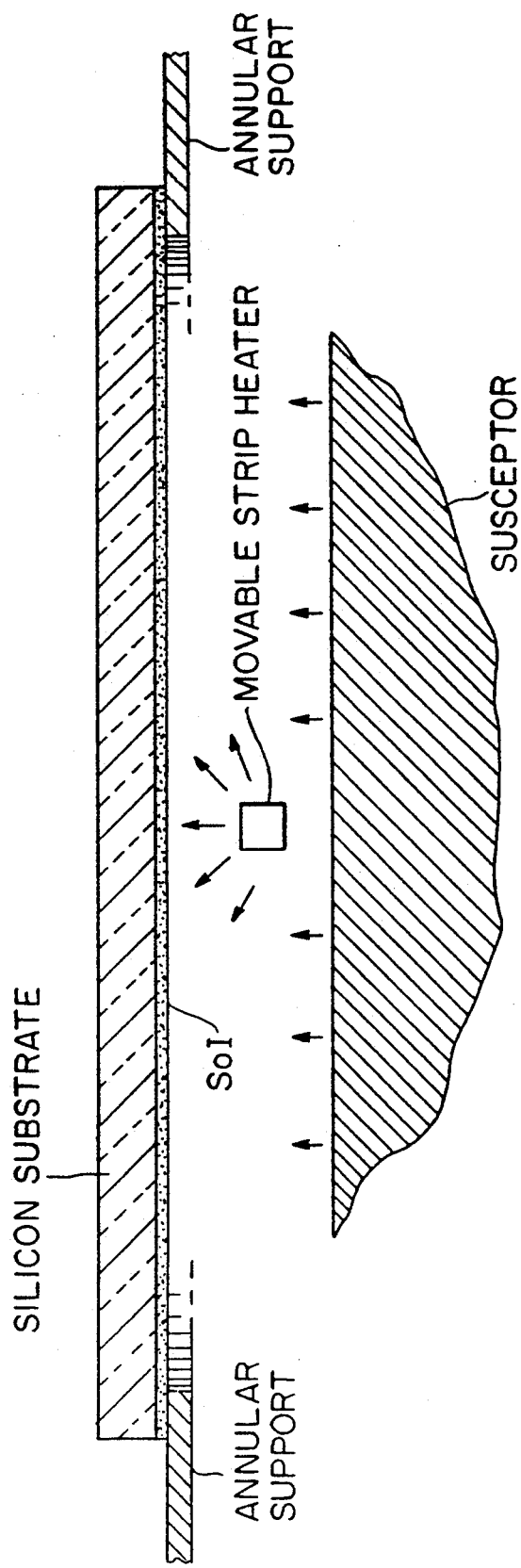
FIG. 4 is a side view showing heat flow of an upside down SOI wafer undergoing enhanced radiative ZMR.

Referring now to FIG. 4, the SOI wafer (illustrated as a single film in FIGS. 3, 4 and 5, but preferably composed of the three layer system of FIG. 2) is supported with the amorphous silicon film face (preferably capped) opposite and in radiative contact with a radiative heating element such as a susceptor which radiatively heats the amorphous silicon layer to a prescribed base temperature. The radiation passes through the SiO$_2$ cap to the film layer. The strip heater then scans across the wafer in the region between the susceptor and the wafer thereby converting the amorphous silicon layer to single crystalline silicon by ZMR. In this method, the amount of effective radiative heating of the wafers is increased by using a radiative source to contribute to the initial heating to the base temperature. Since the radiant energy contribution to the heat input is now enhanced, the radiation intensity profile for the ZMR process is more easily adjusted over a wider range of experimental parameters. For example, by controlling the temperature of the susceptor, temperature of the movable strip heater, and size, shape, and position of the strip heater, one can tailor the intensity profile with more flexibility to produce subboundary-free, low defect density SOI materials.

The enhanced radiative heating ZMR technique of the present invention is particularly advantageous for the preparation of SOI wafers of about 0.5 micron thickness or less. The absorption depth of radiant energy impinging on a thin silicon wafer may be larger than the silicon film thickness itself. In this case, only a small amount of the incident energy is absorbed to heat the silicon film while the remaining passes through the amorphous silicon layer to the substrate where it is absorbed, heating the substrate. In turn the substrate conductively heats the amorphous layer, thereby reducing the relatively radiative heat input component to the conductive heat input component.

In the present invention, the amount of radiative heating is enhanced by using a radiative source to heat the silicon film to its base temperature. This effect can be further enhanced by judiciously choosing the composition of the susceptor and strip heater element and therefore their radiative spectra. For example, greater radiative heat input is possible using a material such as tungsten whose black body spectrum corresponds more closely to the absorption spectrum of silicon than graphite whose radiative emissions occur at a lower energy. Selecting the radiative heater composition in this way, can, of course, be employed in conventional ZMR systems as well to improve their performance.

In the preferred embodiment, the wafer is supported about its periphery with an annular ring. Although the configuration of FIG. 4 illustrates the wafer placed faced down (with the polysilicon in radiative contact) above the moveable strip heater and susceptor, it should be evident to those skilled in the art that the opposite configuration in which the wafer is positioned face up below the moveable heater and susceptor is also possible. In either case, an annular heat sinking support ring might be used to reduce edge defects as discussed in U.S. Ser. No. 238,311. Alternatively, an annular ring might prevent radiative heating of the wafer edge by both the susceptor and/or moveable strip heater by reflection or absorption of the incident energy, thereby insulating the edge of the wafer, reducing its temperature and thereby reducing edge defects. The rings for heat sinking or insulating may be part of the wafer support or an additional member serving only the purpose of reducing edge defects.

The base temperature of the wafer is typically about 1150° C. and the moveable strip heater heats the silicon film beneath to a temperature of about 1410° C. Preferably, the moveable strip heater is a tungsten element 2.5 mm wide and 0.15 mm thick, held 2 mm above the wafer surface. The strip heater scans across the wafer with a linear velocity of about 0.1 mm/sec.

Figure 5:
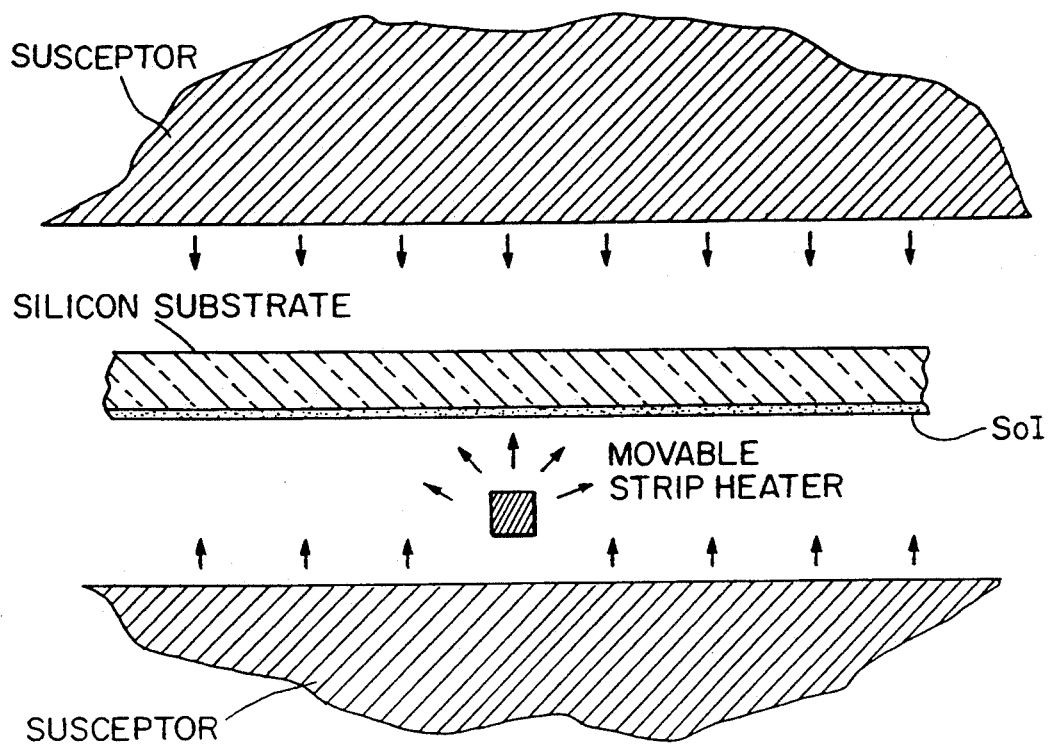
FIG. 5 is a second embodiment of the enhanced radiative ZMR system with an upper susceptor.

In FIG. 5, another embodiment of the invention is shown which includes a second susceptor located facing the backside of the wafer which can conductively heat the amorphous silicon film layer through the silicon substrate. In this configuration, the amount of radiant energy from the first susceptor, required to bring the wafer to its base temperature may be varied by increasing or decreasing the conductive heating effect of the second susceptor. The interplay and adjustment of the heating elements allows for optimization of the ZMR condition for producing high quality crystals.

Several modifications and variations of the present invention are possible when considered in the light of the above teachings. It is therefore understood that the scope of the present invention is not to be limited to the details disclosed herein, may be practiced otherwise than is an specifically described, and is intended only to be limited by the claims appended hereto:

What is claimed is:

1. A method for preparing a SOI wafer having a monocrystalline semiconductor material film on a substrate comprising the steps of:
   supporting the wafer;
   providing a first heater positioned over the wafer, the first heater being stationary relative to the wafer;
   providing a second heater positioned below the wafer, the second heater being stationary relative to the wafer;
   providing a third heater adapted for heating regions of the film to melt the regions by relative motion between the third heater and the wafer;
   radiatively heating the film using the first heater and the second heater such that a relative thermal contribution of the first heater and the second heater produces a base temperature in the film below the melting point of the film;
   heating contiguous regions of the film with radiant energy from the third heater to melt the regions of the film; and
   solidifying the contiguous regions of the film to produce substantially monocrystalline semiconductor material.

2. The method of claim 1 wherein the steps of heating and solidifying include successively heating to melt and solidify contiguous regions of the film.

3. The method of claim 1 wherein a radiation intensity profile is controlled by movement of the third heater relative to a surface of the film.

4. The method of claim 1 wherein said radiatively heating step includes uniformly illuminating the film across the wafer.

5. The method of claim 4 wherein the first heater comprises a first radiative source for heating to the base temperature, the second heater comprises a second heat source for heating to the base temperature, and the third heater comprises a third radiative source for heating to melt the film such that the radiant heat input is controlled by adjusting the relative radiation contribution of said first and second sources.

6. The method of claim 1 wherein heating to the base temperature is done by a combination of radiative and conductive heating.

7. The method of claim 5 wherein the source conductively heats the film and the radiant heat input is controlled by controlling the relative heat contribution of the first, second and third sources.

8. The method of claim 1 wherein step of supporting includes supporting the wafer about the periphery of the wafer with an annular support member.

9. The method of claim 8 wherein the supporting member is a heat sink for reducing edge defects.

10. The method of claim 8 wherein the supporting member is an insulating member for reducing edge defects.

* * * * *